United States Patent
Kim (10) Patent No.: US 7,843,243 B2
(45) Date of Patent: Nov. 30, 2010

(54) FLIP-FLOP CIRCUIT, PIPELINE CIRCUIT INCLUDING A FLIP-FLOP CIRCUIT, AND METHOD OF OPERATING A FLIP-FLOP CIRCUIT

(75) Inventor: Min-su Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 61 days.

(21) Appl. No.: 12/222,481

(22) Filed: Aug. 11, 2008

(65) Prior Publication Data

US 2009/0039936 A1  Feb. 12, 2009

(30) Foreign Application Priority Data

Aug. 10, 2007  (KR)  ..................... 10-2007-0080594

(51) Int. Cl.
 *H03K 3/289*  (2006.01)
 *H03K 3/356*  (2006.01)

(52) U.S. Cl. .................. 327/202; 327/199; 327/200; 327/203

(58) Field of Classification Search ................ 327/161, 327/185, 199–203, 208–212, 214, 218
See application file for complete search history.

(56) References Cited

U.S. PATENT DOCUMENTS

| | | | |
|---|---|---|---|
| 5,821,791 A | | 10/1998 | Gaibotti et al. |
| 6,060,924 A | * | 5/2000 | Sugano .................. 327/202 |
| 6,181,180 B1 | * | 1/2001 | Chen et al. .............. 327/211 |
| 6,937,079 B1 | * | 8/2005 | Zhao et al. .............. 327/200 |
| 2003/0052716 A1 | | 3/2003 | Kim et al. |

FOREIGN PATENT DOCUMENTS

| | | |
|---|---|---|
| KR | 10-2004-0035499 | 4/2004 |
| KR | 10-2005-0104530 | 11/2005 |

* cited by examiner

*Primary Examiner*—Lincoln Donovan
*Assistant Examiner*—Brandon S Cole
(74) *Attorney, Agent, or Firm*—Harness, Dickey & Pierce, P.L.C.

(57) ABSTRACT

Example embodiments relate to an electronic circuit, for example, a flip-flop circuit, a pipeline circuit including the flip-flop circuit and a method for operating the flip-flop circuit. A flip-flop circuit may include a precharge transistor configured to precharge an internal node to a first power supply voltage in response to a clock signal, a first pull-down unit configured to pull down a voltage of the internal node to a second power supply voltage, a pull-up transistor configured to pull up a voltage of an output node to the first power supply voltage in response to the voltage of the internal node, and a second pull-down unit configured to pull down the voltage of the output node to the second power supply voltage. The pipeline circuit may include a pulse generating circuit, a first flip-flop group, a combination logic circuit, and a second flip-flop group. A method for operating a flip-flop circuit may include precharging an internal node to a first power supply voltage in response to a clock signal, pulling down a voltage of the internal node, pulling down the voltage to a second power supply voltage in response to a first pulse signal, and pulling up a voltage of an output node to the first power supply voltage.

24 Claims, 5 Drawing Sheets

FIG. 4

FLIP-FLOP CIRCUIT, PIPELINE CIRCUIT INCLUDING A FLIP-FLOP CIRCUIT, AND METHOD OF OPERATING A FLIP-FLOP CIRCUIT

PRIORITY STATEMENT

This U.S. non-provisional patent application claims the benefit of Korean Patent Application No. 10-2007-0080594, filed on Aug. 10, 2007, in the Korean Intellectual Property Office, the disclosure of which is incorporated herein in its entirety by reference.

BACKGROUND

1. Field

Example embodiments relate to an electronic circuit, for example, a flip-flop circuit, a pipeline circuit including the flip-flop circuit, and a method for operating the flip-flop circuit.

2. Description of the Related Art

Flip-flops (flip-flop circuits) may be used as data memory elements in a digital circuit, such as a semiconductor integrated circuit, for example. A flip-flop may sample an input data signal in order to convert the input data signal into an output signal according to a clock signal. Flip-flops have been widely employed in semiconductor memory devices, such as dynamic random access memory (DRAM), processors, and computers, for example.

Flip-flops may be categorized into static flip-flops and dynamic flip-flops. Conventional static flip-flops may have a simple circuit structure, consume relatively smaller amounts of power, and operate at lower speeds. In contrast, dynamic flip-flops may have a complicated circuit structure, consume relatively larger amounts of powers, and operate at higher speeds.

SUMMARY

Example embodiments provide a flip-flop circuit, a pipeline circuit including the flip-flop circuit, and a method for operating the flip-flop circuit.

According to example embodiments, a flip-flop circuit may comprise a precharge transistor configured to precharge an internal node to a first power supply voltage in response to a clock signal, a first pull-down unit configured to pull down a voltage of the internal node to a second power supply voltage, a pull-up transistor configured to pull up a voltage of an output node to the first power supply voltage in response to the voltage of the internal node, and a second pull-down unit configured to pull down the voltage of the output node to the second power supply voltage. The second power supply voltage may be lower than the first power supply voltage.

The first pull-down unit may include a first pull-down transistor configured to pull down the voltage of the internal node in response to an input data signal, and a second pull-down transistor configured to pull down the voltage being pulled down by the first pull-down transistor to the second power supply voltage in response to a first pulse signal.

The second pull-down unit may include a third pull-down transistor configured to pull down a voltage of the output node in response to an inversion signal of an input data signal, and a fourth pull-down transistor configured to pull down the voltage being pulled down by the third pull-down transistor to the second voltage in response to a second pulse signal.

The precharge transistor may precharge the internal node to the first power supply voltage in response to a delayed signal of the clock signal.

The flip-flop circuit may further comprise a first pulse generating unit and a second pulse generating unit. The first pulse generating unit may include a NOR gate configured to perform a NOR operating on an inversion signal of a pulse signal and an output signal to generate a first pulse signal. The second pulse generating unit may include an inverter configured to invert the inversion signal of the pulse signal to generate a second pulse signal.

The flip-flop circuit may further comprise a data input unit. The data input unit may apply the first power supply voltage to the internal node in response to an input data signal.

The flip-flop circuit may further comprise an internal latch unit connected to the internal node and an output latch unit connected to the output node.

The flip-flop circuit may further comprise a pulse generating circuit. The pulse generating circuit may include a delay unit configured to generate the delayed signal of the clock signal and an inversion signal of the delayed clock signal, and a NAND gate configured to perform an NAND operation on the clock signal and the inversion signal of the delayed clock signal to generate an inversion signal of the pulse signal.

According to example embodiments, the precharging transistor may precharge the internal node to the first power supply voltage in response to the clock signal. In an alternative example embodiment, the precharging transistor may precharge the internal node to the first power supply voltage in response to a first pulse signal.

According to example embodiments, a pipeline circuit may include a pulse generating circuit configured to generate a delayed signal of a clock signal and an inversion signal of a pulse signal, a first flip-flop group including a plurality of flip-flops, a combination logic circuit configured to perform a logic operation on the output signals received from the first flip-flop group, and a second flip-flop group including a plurality of flip-flops. Each of the flip-flops included in the first and second flip-flop groups may include the flip-flop circuit described above. The first flip-flop group may be configured to generate output signals by sampling input signals in response to the delayed signal of the clock signal and the inversion signal of the pulse signal. The second flip-flop group may be configured to generate output signals by sampling signals received from the combination logic circuit in response to the delayed signal of the clock signal and the inversion signal of the pulse signal.

According to example embodiments, a pipeline circuit may include a pulse generating circuit configured to generate a delayed signal of a clock signal and an inversion signal of a pulse signal, a plurality of flip-flop groups, and a plurality of combination logic circuits connected between the flip-flop groups. Each flip-flop group may include a plurality of flip-flops and configured to generate output signals by sampling input signals in response to the delayed signal of the clock signal and the inversion signal of the pulse signal. Each of the flip-flops may include the flip-flop circuit described above. Each combination logic circuit may be configured to perform a logic operation on the output signals received from a corresponding flip-flop group to generate output signals. The corresponding flip-flop group may be configured to apply the output signals to a subsequent flip-flop group.

According to example embodiments, a method of operating a flip-flop circuit may include precharging an internal node to a first power supply voltage in response to a clock signal, pulling down the voltage being pulled down by the first pull-down transistor in response to an input data signal, pulling down the voltage being pulled down by the first pull-down transistor to a second power supply voltage using a second pull-down transistor in response to a first pulse signal, and pulling up a voltage of an output node to the first power supply voltage in response to the voltage being pulled down by the second pull-down transistor.

BRIEF DESCRIPTION OF THE DRAWINGS

The above and other features and advantages will become more apparent by describing in detail example embodiments thereof with reference to the attached drawings in which.

DETAILED DESCRIPTION OF EXAMPLE EMBODIMENTS

Detailed example embodiments are disclosed herein. However, specific structural and function details disclosed herein are merely representative for purposes of describing example embodiments. Accordingly, example embodiments are capable of various modifications and alternative forms. It should be understood, however, that there is not intent to limit example embodiments to the particular forms disclosed, but on the contrary, example embodiments are to cover all modifications, equivalents, and alternatives falling within the scope of the application.

It will be understood that, although the terms first, second, third and fourth may be used herein to describe various elements, these elements should not be limited by these terms. These terms are only used to distinguish one element from another. For example, a first element could be termed a second element, and, similarly, a second element could be termed a first element, without departing from the scope of example embodiments. As used here, the term "and/or" includes any and all combination of one or more of the associated listed items.

The terminology used herein is for the purpose of describing particular embodiments only and is not intended to be limiting. As used here, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the present or addition of one or more other features, integers, steps, operations, elements, components, and/or groups thereof.

Example embodiments will now be described more fully with reference to the accompanying drawings. This invention, however, may be embodied in many different forms and should not be construed as limited to example embodiments set forth therein. Rather, example embodiments re provided so that this disclosure will be thorough and complete, and will fully convey the scope of the application to those skilled in the art. In the drawings, like numbers refer to like elements throughout.

Figure 1:
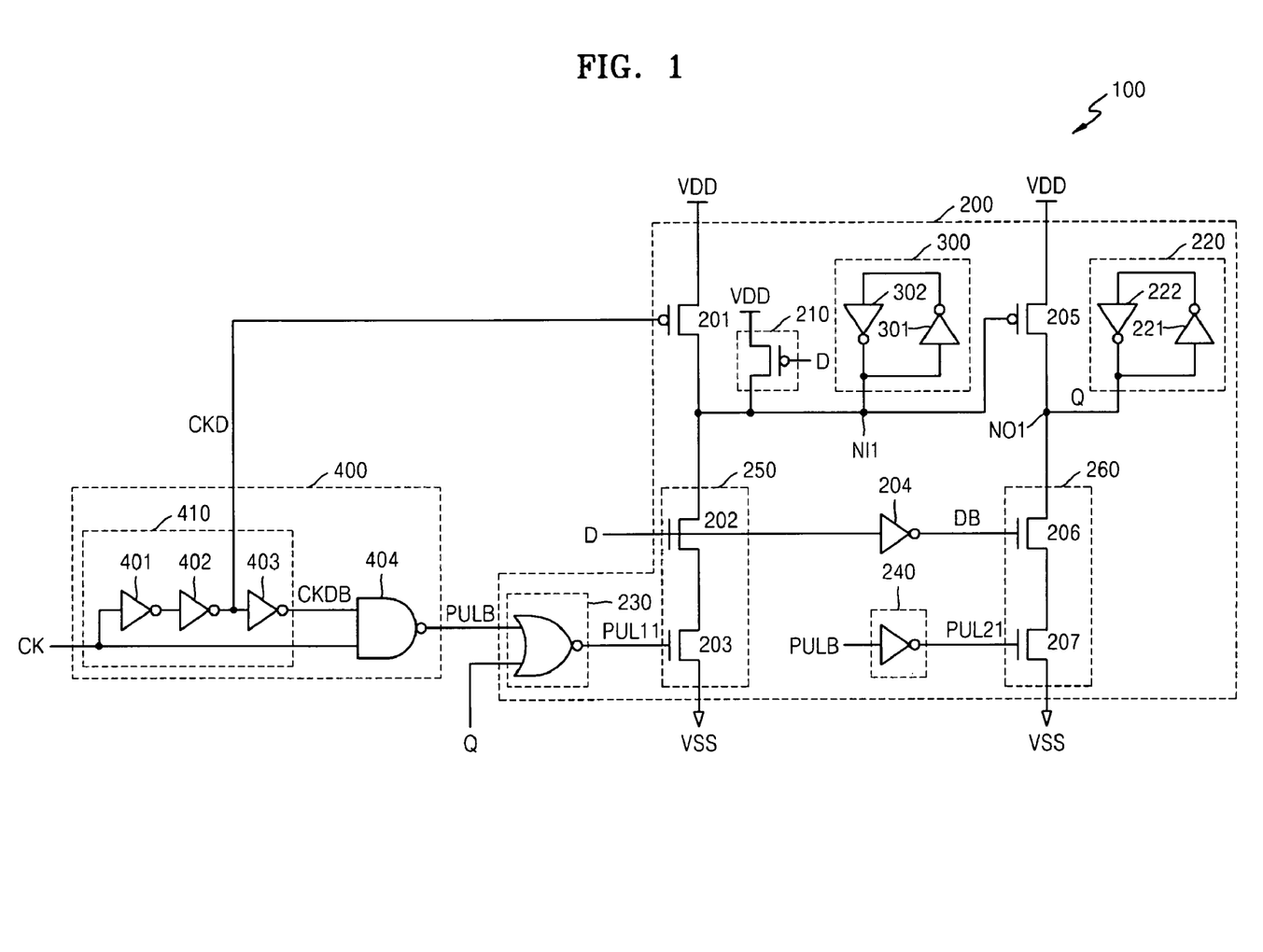
FIG. 1 is a circuit diagram of a flip-flop circuit according to an example embodiment.

FIG. 1 is a circuit diagram of a flip-flop circuit 100 according to an example embodiment. Referring to FIG. 1, the flip-flop circuit 100 may include a flip-flop 200 and a pulse generating circuit 400. The flip-flop circuit 100 may be a pulse-based flip-flop circuit, for example.

The flip-flop 200 may include a precharge transistor 201, a first pull-down unit 250, a pull-up transistor 205, a second pull-down unit 260, an inverter 204, a first pulse generating unit 230, a second pulse generating unit 240, a data input unit 210, an internal latch unit 300, and an output latch unit 220.

The pulse generating circuit 400 may include a delay unit 410 and a NAND gate 404. The pulse generating circuit 400 may be configured to receive a clock signal CK and generate a delayed signal CKD of the clock signal CK, an inversion signal CKDB of the delayed signal CKD, and an inversion signal PULB of the pulse signal, based on the clock signal CK.

The delay unit 410 may include a plurality of inverters 401-403. The plurality of inverters 401-403 may be connected in series. The inverter 402 may generate the delayed signal CKD of the clock signal CK. The inverter 403 may generate the inversion signal CKDB of the delayed signal CKD. The NAND gate 404 may receive the clock signal CK and the inversion signal CKDB of the delayed signal CKD and perform a NAND operation. Based on the results of the NAND operation, the NAND gate 404 may generate the inversion signal PULB of the pulse signal. The pulse width of the inversion signal PULB of the pulse signal may be determined by the total amount of time delay of the plurality of inverters 401-403.

The flip-flop 200 may be configured to receive the delayed signal CKD of the clock signal CK, the inversion signal PULB of the pulse signal, and an input data signal D and generate an output signal Q. The flip-flop 200 may include a plurality of first power supply voltages and a plurality of second power supply voltages. For instance, each of the plurality of the first supply voltages may be a high power supply voltage, such as VDD, as shown on FIG. 1. Each voltage of the plurality of second power supply voltages may be a voltage lower than each of the plurality of first power supply voltages. Each of the plurality of second power supply voltages may be a ground voltage, such as VSS.

The first pulse generating unit 230 may receive the inversion signal PULB generated from the pulse generating circuit 400 and the output signal Q. The output signal Q may be the output voltage at output node NO1. The first pulse generating unit 230 may perform a NOR operation using the inversion signal PULB and the output signal Q to generate the first pulse signal PUL11. The first pulse generating unit 230 may be a NOR gate.

The second pulse generating unit 240 may also receive the inversion signal PULB of the pulse signal generated from the pulse generating circuit 400. The second generating unit 240 may invert the inversion signal PULB of the pulse signal to generate the second pulse signal PUL21. The second pulse generating unit 240 may be an inverter. A length of time delayed by the first pulse generating unit 230 and the second pulse generating unit 240 may be substantially equal.

The precharge transistor 201 may precharge an internal node NI1 to the first power supply voltage VDD in response to the delayed signal CKD of the clock signal CK. For instance, when the precharge transistor 201 is activated based on the delayed signal CKD of the clock signal, the first power supply voltage DD is supplied to the internal node NI1. The precharge transistor 201 may be a PMOS transistor. The precharge transistor 201 may include a source connected to the power supply voltage VDD, a gate configured to receive the delayed signal CKD of the clock signal CK, and a drain connected to the internal node NI1.

The first pull-down unit 250 may include a first pull-down transistor 202 and a second pull-down transistor 203. The first pull-down unit 250 may include a short discharge path to the second power supply voltage VSS. The first pull-down unit 250 may pull down a voltage of the internal node NI1 to the second power supply voltage VSS in response to the input data signal D and the first pulse signal PUL11.

The first pull-down transistor 202 may include a drain connected to the internal node NI1, a gate configured to receive the input data signal D, and a source connected to the drain of the second pull-down transistor 203. The first pull-down transistor 202 may be an NMOS transistor. The first pull-down transistor 202 may pull down the voltage of the internal node NI1 in response to the input data signal D.

The second pull-down transistor 203 may include a drain connected to the source of the first pull-down transistor 202, a gate configured to receive the first pulse signal PUL11, and a source connected to the second power supply voltage VSS. The second pull-down transistor 203 may be an NMOS transistor.

The second pull-down transistor 203 may pull down the voltage being pulled down by the first pull-down transistor 202 to the second power supply voltage VSS in response to the first pulse signal PUL11.

The pull-up transistor 205 may pull up a voltage of the output node NO1 to the first power supply voltage VDD in response to the voltage of the internal node NI1. The pull-up transistor 205 may include a source connected to the first power supply voltage VDD, a gate connected to the internal node NI1, and a drain connected to the output node NO1. The pull-up transistor 205 may be a PMOS transistor.

An inverter 204 may receive the input data signal D and generate the inversion signal DB of the input data signal D by inverting the input data signal D.

The second pull-down unit 260 may include a third pull-down transistor 206 and a fourth pull-down transistor 207. The second pull-down unit 260 may include a short discharge path to the second power supply voltage VSS. The second pull-down unit 260 may pull down the voltage of the output node NO1 to the second power supply voltage VSS in response to the inversion signal DB of the input data signal D and the second pulse signal PUL21.

The third pull-down transistor 206 may include a drain connected to the output node NO1, a source connected to the drain of the fourth pull-down transistor 207, and a gate configured to receive the inversion signal DB of the input data signal D. The third pull-down transistor 206 may pull down the voltage of the output node NO1 in response to an inversion signal DB of the input data signal D. The third pull-down transistor 206 may be a PMOS transistor.

The fourth pull-down transistor 207 may pull down the voltage being pulled down by the third pull-down transistor 206 to the second power supply voltage VSS in response to the second pulse signal PUL21. The fourth pull-down transistor 207 may be an NMOS transistor. The fourth pull-down transistor 207 may include a drain connected to the source of the third pull-down transistor 206, a gate configured to receive the second pulse signal PUL21, and the source connected to the second power supply voltage VSS.

The data input unit 210 may be configured to receive the input data signal D, and apply the first power supply voltage VDD to the internal node NI1 in response to the input data signal D. The data input unit 210 may include a PMOS transistor having a source connected to the first power supply voltage VDD, a gate configured to receive the input data signal D, and a drain connected to the internal node NI1.

If the input data signal D transitions to the logic low state, the data input unit 210 may be activated, thus applying the first power supply voltage VDD to the internal node NI1. If the input data signal D transitions to a logic high state, the data input unit 210 may be deactivated, thus removing the first power supply voltage VDD from the internal node NI1. In addition, when the first pulse signal PUL11 and the second pulse signal transition to a logic high state at a time when the logic state of the input data signal D transitions, the data input unit 210 may control the flip-flop circuit 100 to operate normally.

The internal latch unit 300 may be connected to the internal node NI1. The internal latch unit 300 may latch the voltage of the internal node NI1. The internal latch unit 300 may include a first inverter 301 and a second inverter 302. The first inverter 301 may include an input terminal connected to the internal node NI1. The second inverter 302 may include an input terminal connected to an output terminal of the first inverter 301 and an output terminal connected to the internal node NO1. If the flip-flop 200 does not include the internal latch unit 300, the voltage of the internal node NI1 may be latched by parasitic capacitance at the internal node NI1.

The output latch unit 220 may be connected to the output node NO1. The output latch unit 220 may latch the voltage of the output node NO1. The output latch unit 220 may include a first inverter 221 and a second inverter 222. The first inverter 221 may include an input terminal connected to the output node NO1. The second inverter 222 may include an input terminal connected to an output terminal of the first inverter 221 and an output terminal connected to the output node NO1. If the flip-flop 200 does not include the output latch unit 220, the voltage of the output node NO1 may be latched by parasitic capacitance at the output node NO1.

An example operation of the flip-flop circuit 100 will now be described with reference to FIG. 1.

When the clock signal CK transitions to a logic low state, the precharge transistor 201 may be activated. For instance, when the clock signal is the logic low state, the pulse generating unit 400 may generate the delayed signal CKD of the clock signal CK. Based on the logic low state of the generated delayed signal CKD of the clock signal CK, the precharge transistor 201 may be activated.

When the precharge transistor 201 is activated, the internal node NI1 may be precharged to the first power supply voltage VDD. As a result, the pull-up transistor 205 is deactivated in response to the voltage of the internal node NI1 being precharged to the first power supply voltage VDD. Also, when the clock signal CK transitions to the logic low state, the second pull-down transistor 203 and the fourth pull-down transistor 207 may be deactivated based the first and second pulse signals PUL11 and PUL21, thereby maintaining a previous value of the output node NO1.

When the clock signal CK transits from the logic low state to the logic high state, the precharge transistor 201 may stop precharging the internal node NI1 in response to the delayed signal CKD of the clock signal CK. For instance, when the clock signal CK is the logic high state, the pulse generating unit 400 may generate a logic high state of the delayed signal CKD of the clock signal CK. Based on the logic high state of the delayed signal CKD of the clock signal CK, the precharge transistor may be deactivated.

The first pulse signal PUL11 and the second pulse signal PUL21 may be activated to the logic high state, thus activating the second pull-down transistor 203 and the fourth pull-down transistor 207. The first pulse signal PUL11 and the second pulse signal PUL21 may be activated to the logic high state for a short time within a period of time that the clock signal CK (or the delayed signal CKD of the clock signal CK) is activated to the logic high state.

The first pull-down unit 250 may control the logic state of the output signal Q at the output node NO1 using the short discharge path being activated in response to the first pulse signal PUL11. For instance, if the input data signal D transitions to the logic high state, the data input unit 210 may be deactivated removing the first power supply voltage from the internal node NI1. Also, the first pull-down transistor 202 may be activated, and therefore both the first pull-down transistor 202 and the second pull-down transistor 203 are activated, thereby pulling down the voltage of the internal node NI1 to the second power supply voltage VSS. As a result, the pull-up transistor 205 may pull up the voltage of the output node NO1 to the first power supply voltage VDD in response to the voltage of the internal node NI1 being pulled down to the second power supply voltage VSS by the first pull-down unit 250.

Next, the second pull-down transistor 203 may be deactivated in response to the voltage of the output node NO1 being pulled up to the first power supply voltage VDD, thereby preventing the voltage of the internal node NI1 being pulled down by the first pull-down transistor 202 from being further pulled down. In other words, the second pull-down transistor 203 may not pull down the voltage being pulled down by the first pull-down transistor 202 in response to the output signal Q.

The second pull-down unit 260 may control the logic state of the output signal Q at the output node NO1 using the short discharge path being activated in response to the second pulse signal PUL21. If the input data signal D transitions to the logic low state, the data input unit 210 may apply the first power supply voltage to the internal node NI1. Also, the inverter 204 may invert the input data signal D to the logic high state, thereby turning on the third pull-down transistor 206. Since the fourth pull-down transistor 207 is already activated, both the third pull-down transistor 206 and the fourth pull-down transistor 207 may pull down the voltage of the output node NO1 to the second power supply voltage VSS. The length of time that the input data signal D is maintained at a logic state (high or low) may be longer than a time in which the clock signal CK is maintained at a logic state (high or low).

As described above, the first pull-down unit 250 may control the logic state of the output signal Q using the short discharge path being activated in response to the first pulse signal PUL11. As a result, an input-to-output delay (D-to-Q delay) may be reduced and the operating speed of the flip-flop circuit 100 may be improved. The input-to-output delay (D-to-Q delay) may be a delay between when the input data signal D is inputted and when the output signal Q is generated. Furthermore, if the first power supply voltage VDD or the clock signal CK is lowered, the operating speed of the flip-flop circuit 100 may be prevented from decreasing due to the short discharge path. The discharge path may be deactivated in response to the logic high state of the output signal Q at the output node NO1. Therefore, the flip-flop circuit 100 may consume a small amount of power.

As described above, the second pull-down unit 260 may control the output signal Q at the output node NO1 using the short discharge path being activated in response to the second pulse signal PUL21. The D-to-Q delay may be reduced and the operating speed of the flip-flop circuit 100 may be improved. Also, even if the power supply voltage VDD used for generating the input data signal D or the clock signal CK is lowered, the operating speed of the flip-flop circuit 100 may not decrease because the discharge path is short.

According to example embodiments, if the delayed signal CKD of the clock signal CK is supplied to the gate of the precharge transistor 201 instead of the clock signal CK, the internal node NI1 may be precharged for a longer time than if the clock signal CK was supplied to the gate of the precharge transistor 201. In response to the delayed signal CKD of the clock signal CK, the internal node NI1 may be precharged before the second pull-down unit 260 is enable. As a result, the pull-up transistor 205 and the third pull-down transistor 206 may reliably operate.

Figure 2A:
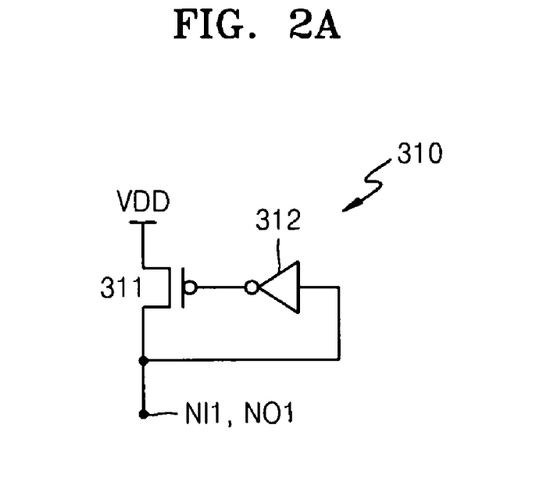
FIG. 2A is a circuit diagram of an internal latch unit (or an output latch unit) illustrated in FIG. 1, according to an example embodiment.

FIG. 24A is a circuit diagram of an internal (or output) latch unit 310 according to an example embodiment. The internal (or output) latch unit 310 may be another example embodiment of the internal latch unit 300 or the output latch unit 220 illustrated in FIG. 1. Referring to FIG. 2A, the internal (or output) latch unit 310 may include a PMOS transistor 311 and an inverter 312. The inverter 312 may include an input terminal connected to the internal node NI1 (or an output node NO1) and an output terminal connected to a gate of the PMOS transistor 311. The PMOS transistor 311 may include a source connected to the first power supply VDD, a gate connected to an output terminal of the inverter 312, and a drain connected to the internal node NI1 (or the output node NO1).

Figure 2B:
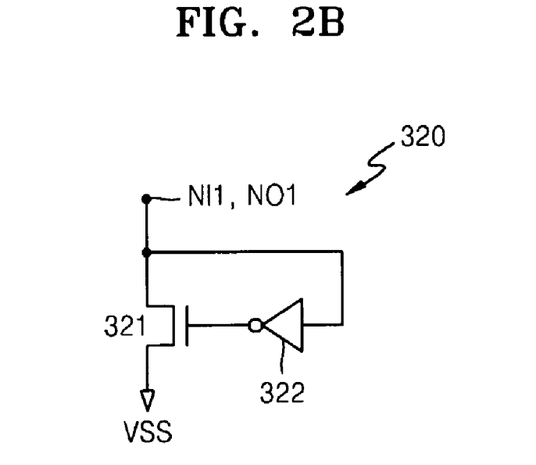
FIG. 2B is a circuit diagram of an internal latch unit (or the output latch unit) illustrated in FIG. 1, according to another example embodiment.

FIG. 2B is a circuit diagram of an internal (or output) latch unit 320 according to another example embodiment. Referring to FIG. 2B, the internal latch unit 320 (or the output latch unit 320) may include an NMOS transistor 321 and an inverter 322.

The inverter 322 may include an input terminal connected to an internal node NI1 (or an output node NO1), and an output terminal connected to a gate of the NMOS transistor 321. The NMOS transistor 321 may include a source connected to the second power supply voltage VSS, a gate connected to an output terminal of the inverter 322, and a drain connected to the internal node NI1 (or the output node NO1).

Figure 2C:
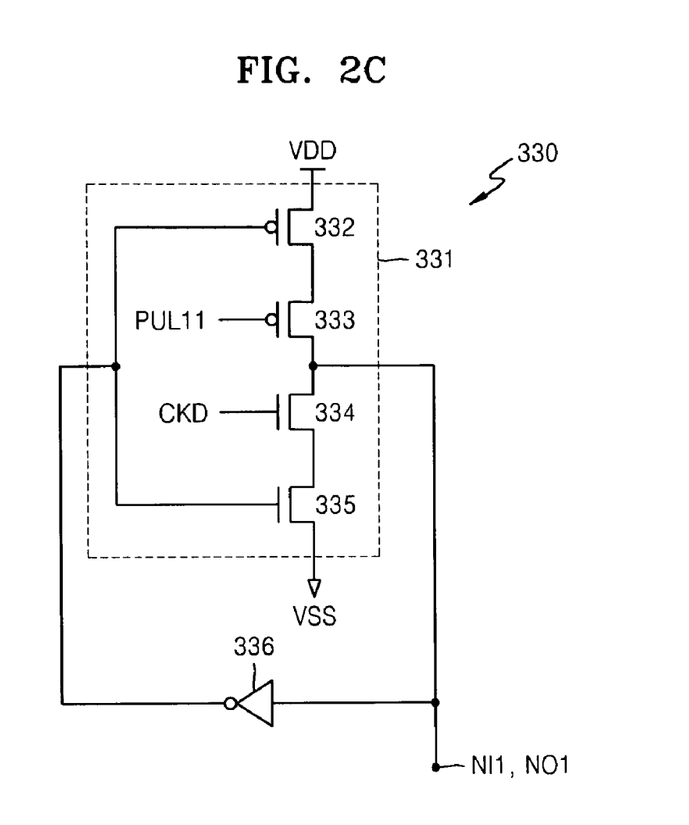
FIG. 2C is a circuit diagram of an internal latch unit (or the output latch unit) illustrated in FIG. 1, according to another example embodiment.

FIG. 2C is a circuit diagram of an internal (or output) latch unit 330 according to another example embodiment. Referring to FIG. 2C, the internal (or output) latch unit 330 may include a tri-state inverter 331 and an inverter 336. The tri-state inverter 331 may include a first PMOS transistor 332, a second NMOS transistor 333, a first NMOS transistor 334, and a second NMOS transistor 335.

The inverter 336 may include an input terminal connected to an internal node NI1 (or an output node NO1) and an output terminal connected to the gates of the first PMOS transistor 332 and the second NMOS transistor 335. The first PMOS transistor 332 may include a source connected to the first power supply voltage VDD, a gate connected to an output terminal of the inverter 332, and a drain connected to a source of the second NMOS transistor 333. The second PMOS transistor 333 may include a source connected to the drain of the first PMOS transistor 332, a gate configured to receive the first pulse signal PUL11, and a drain connected to a source of the first NMOS transistor 334. In an alternative embodiment, the second pulse signal PUL21 may be supplied to the gate of the second PMOS transistor 333 instead of the first pulse signal PUL11.

The first NMOS transistor 334 may include a drain connected to a drain of the second PMOS transistor 333 and the internal node NI1 (or the output node NO1), a gate configured to receive the delayed clock signal CKD of a clock signal CD, and a source connected to a drain of the second NMOS transistor. The second NMOS transistor 335 may include a drain connected to the source of the first NMOS transistor 334, a gate connected to the output terminal of the inverter 336, and a source connected to the second power supply voltage VSS.

Figure 2D:
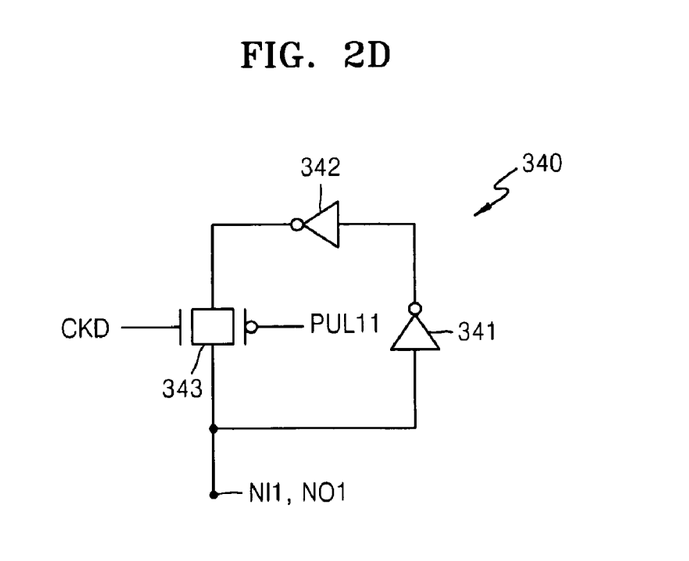
FIG. 2D is a circuit diagram of an internal latch unit (or the output latch unit) illustrated in FIG. 1, according to another example embodiment.

FIG. 2D is a circuit diagram of an internal (or output) latch unit 340 according to another example embodiment. Referring to FIG. 2D, the internal (or output) latch unit 340 may include a first inverter 341, a second inverter 342, and a transmission gate 343.

The first inverter 341 may include an input terminal connected to an internal node NI1 (or an output node NO1) and an output terminal connected to an input terminal of the second inverter. The second inverter 342 may include an input terminal connected to the output terminal of the first inverter 341, and an output terminal connected to the transmission gate 343. The transmission gate 343 may apply a voltage generated in the output terminal of the second inverter 342 to the internal node NI1 (or the output node NO1) in response to the delayed signal CKD of a clock signal CKD and the first pulse signal PUL11. In an alternative embodiment, the transmission gate 343 may apply the voltage generated in the output terminal second inverter 342 to the internal node NI1 (or the output node NO1) in response to the delayed signal CKD of the clock signal CK and the second pulse signal PUL21.

Figure 3:
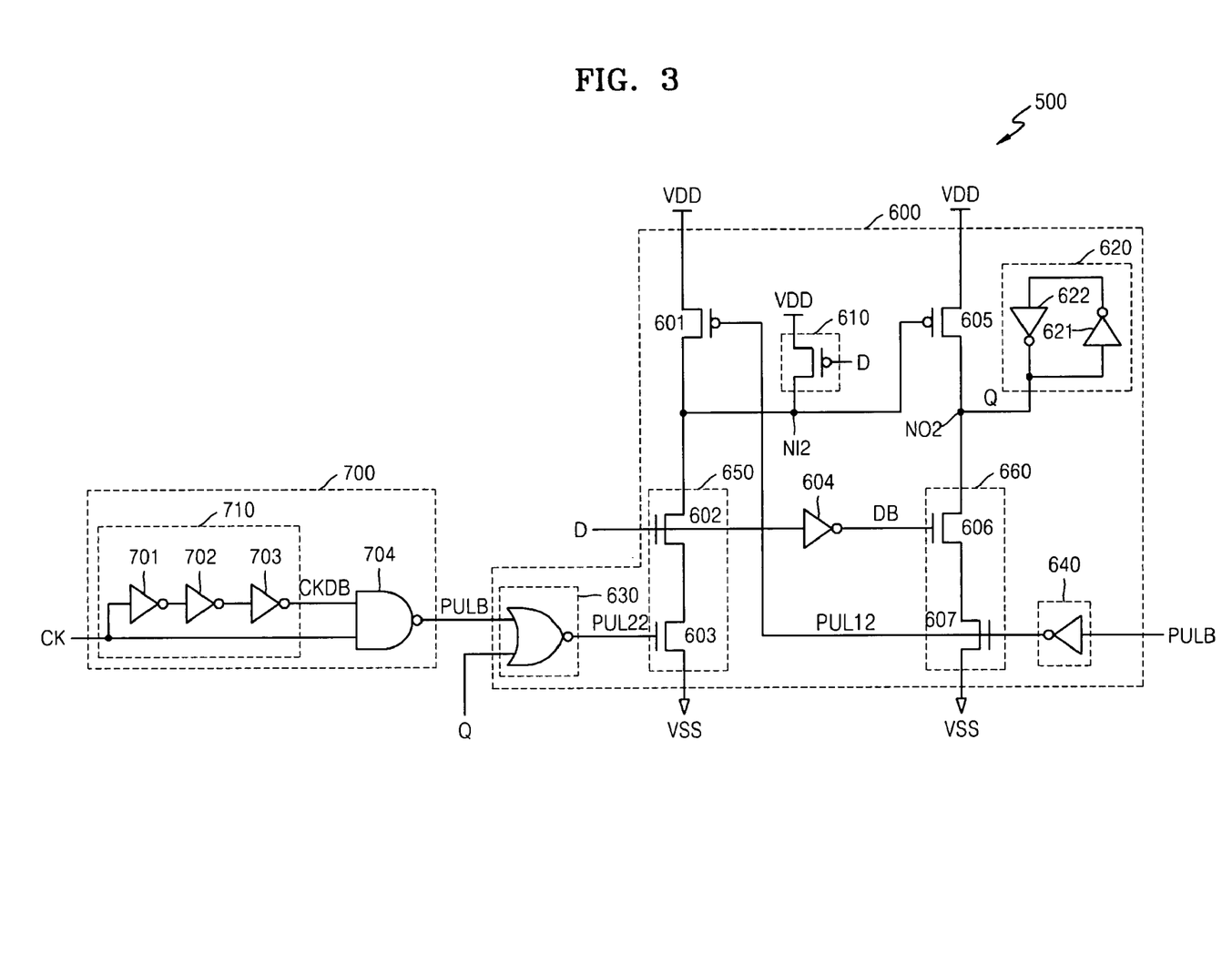
FIG. 3 is a circuit diagram of a flip-flop circuit according to another example embodiment.

FIG. 3 is a circuit diagram of a flip-flop circuit 500 according to another example embodiment. Referring to FIG. 3, the flip-flop circuit 500 may include a flip-flop 600 and a pulse generating circuit 700. The flip-flop circuit 500 may be a pulse-based flip-flop circuit.

The flip-flop 600 may include a precharge transistor 601, a first pull-down unit 650, a pull-up transistor 605, and a second pull-down unit 660, an inverter 604, a first pulse generating unit 630, a second pulse generating unit 640, a data input unit 610, and an output latch unit 620. The flip-flop 600 may not include an internal latch unit, such as the internal latch unit 300 illustrated in FIG. 1.

The pulse generating circuit 700 may include a delay unit 710 and a NAND gate 704. The pulse generating circuit 700 may be similar to the pulse generating circuit 400 illustrated in FIG. 1. The pulse generating circuit 700 may be configured to receive a clock signal CK and generate an inversion signal CKBD of the delayed signal CKD and an inversion signal PULB of the pulse signal, based on the signal clock CK.

The delay unit 710 may include a plurality of inverters 701-703. The plurality of inverters may be connected in series. The delay unit 710 may generate the inversion signal CKDB of the delayed clock signal CKD. The inversion signal CKDB may be generated by the inverter 703. The inverter 702 may selectively generate the delayed clock signal.

The NAND gate 704 may receive the inversion signal CKBD of the delayed clock signal CKD and the clock signal CK and perform a NAND operation. Based on the results of the NAND operation, the pulse generating circuit 700 may generate the inversion signal PULB of the pulse signal. The pulse width of the inversion signal PULB of the pulse signal may be determined by the total amount of time delayed of the plurality of inverters 701-703.

The flip-flop 600 may be configured to receive the inversion signal PULB of the pulse signal, an input data signal D, and generate an output signal D. The flip-flop 600 may include a plurality of first power supply voltages and a plurality of second power supply voltages. For instance, each of the plurality of the first supply voltages may be a high power supply voltage, such as VDD, as shown on FIG. 4. Each voltage of the plurality of second power supply voltages may be a voltage lower than each of the plurality of first power supply voltages. Each of the plurality of second power supply voltages may be a ground voltage, such as VSS.

The first pulse generating unit 630 may receive the inversion signal PULB generated from the pulse generating circuit 700 and the output signal Q. The first generating unit 630 may include a NOR gate a NOR gate that performs a NOR operation on the inversion signal PULB of a pulse signal generated and the output signal Q. Based on the results of the NOR operation, the first generating unit 630 may generate the second pulse signal PUL22.

The second pulse generating unit 640 may receive the inversion signal PULB generated from the pulse generating circuit 700 and invert the inversion signal PULB of the pulse signal to generate the first pulse signal PUL12. A length of time delayed by the first pulse generating unit 230 and the second pulse generating unit 240 may be substantially equal.

The precharge transistor 601 may be a PMOS transistor. The precharge transistor 601 may include a source connected to the first power supply voltage VDD, a gate configured to receive the first pulse signal PUL12, and a drain connected to the internal node NI2. The precharge transistor 601 may precharge an internal node NI2 to the first power supply voltage VDD in response to the first pulse signal PUL12. The first pulse signal PUL12 may correspond to the second pulse signal PUL21 illustrated in FIG. 1. The first pulse signal PUL12 may be activated to a logic high state for a short time within a period of time that the clock signal CK is activated to logic high, thereby precharging the internal node NI2 to the first power supply voltage VDD for a long time in response to the first pulse signal PUL12.

The first pull-down unit 650 may include a first pull-down transistor 602 and a second pull-down transistor 603. The first pull-down unit 650 may include a short discharge path to the second power supply voltage VSS. The first pull-down unit 650 may pull down a voltage of the internal node NI2 to the second power supply voltage VSS.

The first pull-down transistor 602 may include a drain connected to the internal node NI2, a gate configured to receive the input data signal D, and a source connected to a drain of the second pull-down transistor 603. The first pull-down transistor 602 may be an NMOS transistor. The first pull-down transistor 602 may pull down the voltage of the internal node NI2 in response to an input data signal D.

The second pull-down transistor 603 may include a drain connected to a source of the first pull-down transistor 602, a gate configured to receive the second pulse signal PUL22, and a source connected to the second power supply voltage VSS. The second pull-down transistor 603 may be an NMOS transistor.

The second pull-down transistor 603 may pull down the voltage being pulled down by the first pull-down transistor 602 to the second power supply voltage VSS in response to a second pulse signal PUL22 and the output signal Q generated at the output node NO2. The second pulse signal PUL22 may correspond to the first pulse signal PUL11 illustrated in FIG. 1.

The pull-up transistor 605 may pull up the voltage of the output node NO2 to the first power supply voltage VDD in response to the voltage of the internal node NI2. The pull-up transistor 605 may be a PMOS transistor. The pull-up transistor 605 may include a source connected to the first power supply voltage VDD, a gate connected to the internal node NI2, and a drain connected to the output node NO2.

An inverter 604 may generate the inversion signal DB of the input data signal D by inverting the input data signal D.

The second pull-down unit 660 may include a third pull-down transistor 606 and a fourth pull-down transistor 607. The second pull-down unit 660 may include a short discharge path to the second power supply voltage VSS. The second pull-down unit 660 may pull down the voltage of the output node NO2 to the second power supply voltage VSS.

The third pull-down transistor 606 may include a drain connected to the output node NO2 and a gate configured to receive the inversion signal DB of the input data signal D. The third pull-down transistor 606 may be a PMOS transistor. The third pull-down transistor 606 may pull down the voltage of the output node NO2 in response to an inversion signal DB of the input data signal D.

The fourth pull-down transistor 607 may include a drain connected to a source of the third pull-down transistor 606, a gate configured to receive the first pulse signal PUL12, and a drain connected to the second power supply source VSS. The fourth pull-down transistor 607 may be an NMOS transistor. The fourth pull-down transistor 607 may pull down the voltage at the output node NO2 being pulled down by the third pull-down transistor 606 to the second power supply voltage VSS in response to the first pulse signal PUL12.

The data input unit 610 may be configured to receive the input data signal D and apply the first power supply voltage VDD to the internal node NI2 in response to the input data signal D. The data input unit 610 may include a PMOS transistor having a source connected to the first power supply voltage VDD, a gate configured to receive the input data signal D, and a drain connected to the internal node NI2.

If the input data signal D transitions to the logic low state, the data input unit 610 may be activated, thus applying the first power supply voltage VDD to the internal node NI2. If the input data signal D transitions to a logic high state, the data input unit 610 may be deactivated, thus removing the first power supply voltage VDD from the internal node NI2. In addition, when the first pulse signal PUL12 and the second pulse signal PUL22 transition to the logic high state at a time when the logic state of the input data signal D transitions, the data input unit 610 may control the flip-flop circuit 500 to operate normally.

The flip-flop 600 may further include an output latch unit 620 connected to the output node NO2. If the flip-flop 600 does not include the output latch unit 620, the voltage of the output node NO2 may be latched by parasite capacitance generated at the output node NO2.

The output latch unit 620 may latch the voltage of the output node NO2. The output latch unit 620 may include a first inverter 621 and a second inverter 622. The first inverter 621 may include an input terminal connected to the output node NO2. The second inverter 622 may include an input terminal connected to an output terminal of the first inverter 621 and an output terminal connected to the output node NO2.

The output latch unit 620 may also include one of the latch units 310, 320, 330, and 340 illustrated in FIGS. 2A through 2D according to example embodiments.

An example operation of the flip-flop circuit 500 will now be described with reference to FIG. 3.

When the clock CK transitions to a logic low state, the precharge transistor 601 may be activated and the internal node NI2 may be precharged to the first power supply voltage VDD. In response to the logic high state of the internal node NI2, the pull-up transistor 605 may be deactivated. When the clock signal CK transitions to the logic high state, the second pull-down transistor 603 and the fourth pull-down transistor 607 may be deactivated in response to the first and second pulse signals PUL12 and PUL22, thereby maintaining a previous value of the output node NO2.

When the clock signal CK transits from the logic low state to the logic high state, the precharge transistor 601 may stop precharging the internal node NI2 in response to the first pulse signal PUL12. Also, the second pulse signal PUL22 may be activated to the logic high state, thus turning on the second pull-down transistor 603, and the first pulse signal PUL12 may be activated to the logic high state, thus turning on the fourth pull-down transistor 607.

The first pull-down unit 650 may control the logic state of the output signal Q at the output node NO2 using the short discharge path being activated in response to the second pulse signal PUL22. For instance, if the input data signal D transitions to the logic high state, the first pull-down transistor 602 may be activated, and therefore both the first pull-down transistor 602 and the second pull-down transistor 603 are activated, thereby pulling down the voltage of the internal node NI2 to the logic low state. As a result, the pull-up transistor 605 may pull up the voltage of the output node NO2 to the first power supply voltage VDD in response to the voltage of the internal node NI2 being pulled down to the second power supply voltage VSS.

Next, the second pull-down transistor 603 may be deactivated in response to the voltage of the output node NO2 being pulled up to the first power supply voltage VDD, thereby preventing the voltage of the internal node NI2 being pulled down by the first pull-down transistor 602 from being further pulled down. In other words, the second pull-down transistor 603 may not pull down the voltage being pulled down by the first pull-down transistor 602 in response to the output signal Q.

The second pull-down unit 660 may control the logic state of the output signal Q at the output node NO2 using the short discharge path being activated in response to the first pulse signal PUL12. For instance, if the input data signal D transitions to a logic low state, the activated third and fourth pull-down transistors 606 and 607 may pull down the voltage of the output node NO2 to the second power supply voltage VSS.

As described above, the first pull-down unit 650 may control the logic state of the output signal Q using the short discharge path being activated in response to the second pulse signal PUL22. As a result, an input-to-output delay (D-to-Q delay) may be reduced and the operating speed of the flip-flop circuit 500 may be improved. Furthermore, if the first power supply voltage VDD or the clock signal CK is lowered, the operating speed of the flip-flop circuit 500 may be prevented from decreasing due to the short discharge path. The discharge path may be deactivated in response to the logic high state of the output signal Q at the output node NO2. Therefore, the flip-flop circuit 500 may consume a small amount of power.

As described above, the second pull-down unit 260 may control the output signal Q at the output node NO1 using the short discharge path being activated in response to the first pulse signal PUL12. The D-to-Q delay may be reduced and the operating speed of the flip-flop circuit 500 may be improved. Also, even if the power supply voltage VDD used for generating the input data signal D or the clock signal CK is lowered, the operating speed of the flip-flop circuit 500 may not decrease because the discharge path is short.

In response to the first pulse signal PUL12, the internal node NI2 may be precharged before the second pull-down unit 660 is enable. As a result, the pull-up transistor 605 and the third pull-down transistor 606 may reliably operate.

Figure 4:
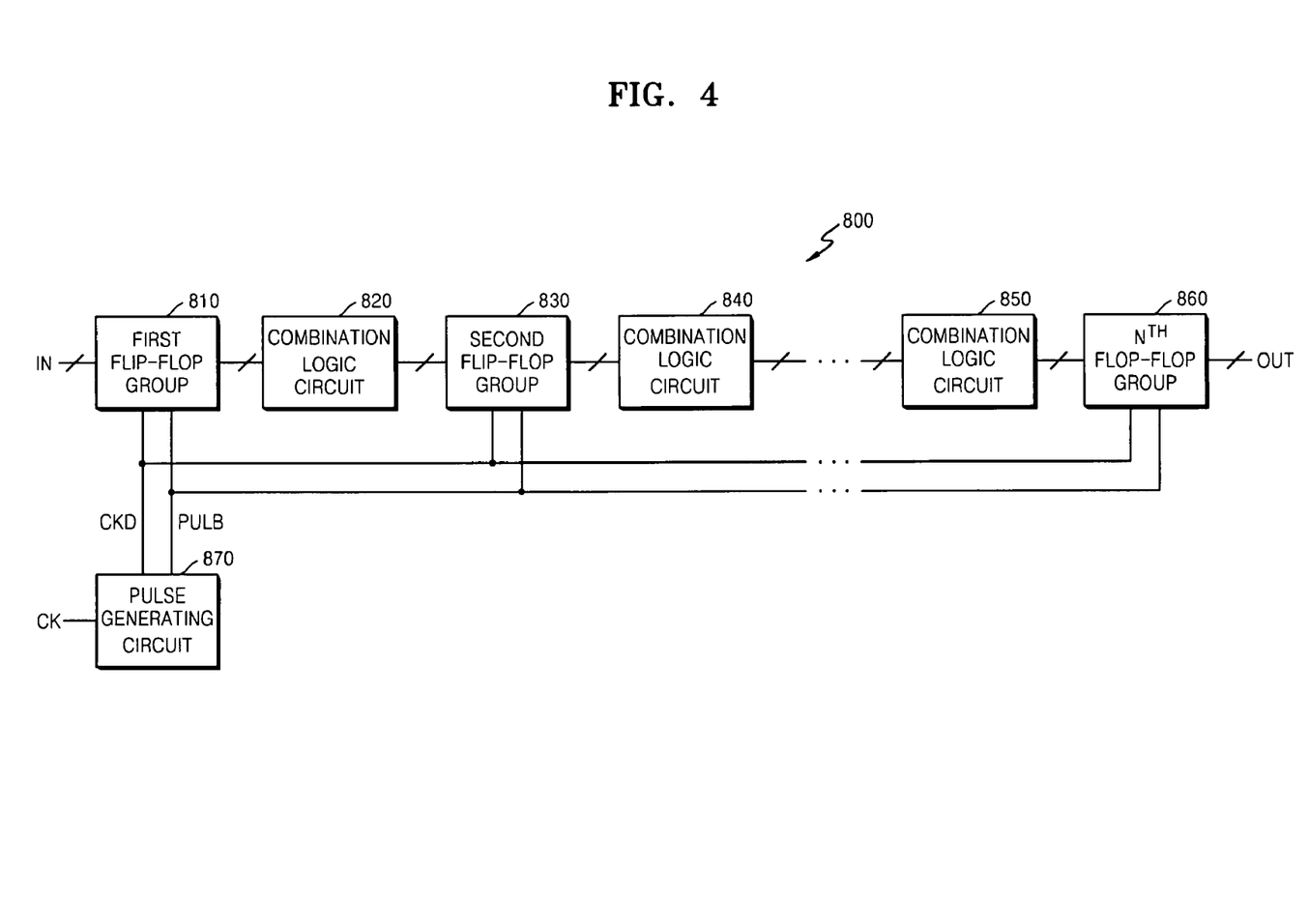
FIG. 4 is a block diagram of a pipeline circuit according to an example embodiment.

FIG. 4 is a block diagram of a pipeline circuit 800 according to an example embodiment. Referring to FIG. 4, the pipeline circuit 800 may include a plurality of flip-flop groups. The plurality of flip-flop groups may include a first flip-flop group 810 and a second flip-flop group 830 to an $N^{th}$ flip-flop group 860. The pipeline circuit 800 may further include a plurality of combination circuits. The plurality of combination circuits may include a first combination logic circuit 820, a second combination logic circuit 840 to (N−1) combination logic circuit 850. N may be a natural number equal to or greater than 2. The pipeline circuit 800 may further include a pulse generating circuit 870. The pipeline circuit 800 may generate output signals OUT by processing input signals IN. For example, the input signals IN may be 32-bit parallel signals.

The pulse generating circuit 870 may be similar to the pulse generating circuit 400 illustrated in FIG. 1 or the pulse generating circuit 700 illustrated in FIG. 3, for example. The pulse generating circuit 870 may generate a delayed signal CKD of a clock signal CK, and an inversion signal PULB of a pulse signal generated from the clock signal CK. If the pulse generating circuit 870 is the pulse generating circuit 700, the pulse generating circuit 870 may not output the delayed signal CKD of the clock signal CK.

Each of the plurality of flip flop groups may include a plurality of flip-flops. Each of the flip-flops may include the flip-flop 200 illustrated in FIG. 1 or the flip-flop 600 illustrated in FIG. 3, for example. The pipeline circuit 200 may operate at a relatively high speed and may consume a relatively small amount of power.

The input signals IN may be provided to the first flip-flop group 810. The output signals OUT may be outputted from the $N^{th}$ flip-flop group 860. The input data signal D provided to the flip-flop 200 or the flip-flop 600 may be one of the input data signals IN. The output signal Q outputted from the flip-flop 200 or the flip-flop 600 may be one of the output signals OUT.

If each of the plurality of flip-flop groups are similar to the flip-flop 200, the first flip-flop group 810 and the second flip-flop group 830 to the $N^{th}$ flip-flop group 860 may sample the input signals IN and generate the output signals OUT in response to the delayed signal CKD of the clock signal CK and the inversion signal PULB of the pulse signal.

If each of the plurality of flip-flop groups are similar to the flip-flop 600, the first flip-flop group 810 and the second flip-flop group 830 to the $N^{th}$ flip-flop group 860 may sample the input signals IN and generate the output signals OUT in response to the inversion signal PULB of the pulse signal.

As described above, since the pulse generating circuit 870 drives the first flip-flop group 810 and the second flip-flop group 830 to the $N^{th}$ flip-flop group 860, the pipeline circuit 800 may occupy a relatively small area and consume a relatively small amount of power.

The first combination logic circuit 820, the second combination logic circuit 840 to the (N−1) combination logic circuit 850 may be respectively connected between adjacent flip-flop groups from among the first flip-flop group 810 and the second flip-flop group 830 to the $N^{th}$ flip-flop group 860. For example, the first combination logic circuit 820, the second combination logic circuit 840 to the (N−1) combination logic circuit 850 may be adders or multipliers.

Each of the first combination logic circuit 820, the second combination logic circuit 840 to the (N−1) combination logic circuit 850 may generate output signals by performing logic combination operation (logic operation) on signals received from a corresponding flip-flop group. Each of the first combination logic circuit 820, the second combination logic circuit 840 to the (N−1) combination logic circuit 850 may supply the output signals to subsequent flip-flop group.

A flip-flop circuit according to example embodiments may operate at higher speeds and consume a smaller amount of power than a conventional flip-flop circuit.

A method for operating a flip-flop circuit according to an example embodiment may be capable of increasing the operating speed of the flip-flop circuit and reducing the amount of power consumed by the flip-flop circuit.

A pipeline circuit according to example embodiments may include a flip-flop circuit according to example embodiments, and thus may operate at higher speeds, consume a smaller amount of power, and occupy a smaller circuit area than a convention pipeline circuit.

While example embodiments have been shown and described with reference to FIGS. 1-4, it will be understood by those skilled in the art that various changes in form and details may be made therein without departing from the spirit and scope of this disclosure.

What is claimed is:

1. A flip-flop circuit comprising:
   a precharge transistor configured to precharge an internal node to a first power supply voltage in response to a clock signal;
   a first pull-down unit configured to pull down a voltage of the internal node to a second power supply voltage, the second power supply voltage being lower than the first power supply voltage;
   a pull-up transistor configured to pull up a voltage of an output node to the first power supply voltage in response to the voltage of the internal node; and
   a second pull-down unit configured to pull down the voltage of the output node to the second power supply voltage, wherein the first pull-down unit includes:
      a first pull-down transistor configured to pull down the voltage of the internal node in response to an input data signal; and
      a second pull-down transistor configured to pull down the voltage being pulled down by the first pull-down transistor to the second power supply voltage in response to a first pulse signal, and to not pull down the voltage being pulled down by the first pull-down transistor in response to the output signal.

2. The flip-flop circuit of claim 1, wherein the second pull-down unit includes:
   a third pull-down transistor configured to pull down a voltage of the output node in response to an inversion signal of an input data signal; and
   a fourth pull-down transistor configured to pull down the voltage being pulled down by the third pull-down transistor to the second power supply voltage in response to a second pulse signal.

3. The flip-flop circuit of claim 1, further comprising a first pulse generating unit and a second pulse generating unit, the first pulse generating unit includes a NOR gate configured to perform a NOR operation on an inversion signal of a pulse signal and an output signal to generate the first pulse signal, the second pulse generating unit includes an inverter configured to invert the inversion signal of the pulse signal to generate a second pulse signal.

4. The flip-flop circuit of claim 1, further comprising a data input unit, wherein the data input unit applies the first power supply voltage to the internal node in response to the input data signal.

5. The flip-flop circuit of claim 4, wherein the data input unit includes a source connected to the first power supply voltage, a gate configured to receive the input data signal, and a drain connected to the internal node.

6. The flip-flop circuit of claim 1, further comprising an internal latch unit connected to the internal node.

7. The flip-flop circuit of claim 6, wherein the internal latch unit includes:
a first inverter having an input terminal connected to the internal node; and
a second inverter having an input terminal connected to an output terminal of the first inverter and an output terminal connected to the internal node.

8. The flip-flop circuit of claim 6, wherein the internal latch unit includes:
an inverter having an input terminal connected to the internal node; and
a PMOS transistor having a source connected to the first power supply voltage, a gate connected to an output terminal of the inverter, and a drain connected to the internal node.

9. The flip-flop circuit of claim 6, wherein the internal latch unit includes:
an inverter having an input terminal connected to the internal node; and
an NMOS transistor having a source connected to the second power supply voltage, a gate connected to an output terminal of the inverter, and a drain connected to the internal node.

10. The flip-flop circuit of claim 6, wherein the internal latch unit includes:
an inverter having an input terminal connected to the internal node;
a first PMOS transistor having a source connected to the first power supply voltage and a gate connected to an output terminal of the inverter;
a second PMOS transistor having a source connected to a drain of the first PMOS transistor and a gate configured to receive the first pulse signal;
a first NMOS transistor having a drain connected to a drain of the second PMOS transistor and the internal node, and a gate configured to receive the clock signal; and
a second NMOS transistor having a drain connected to a source of the first NMOS transistor, a gate connected to an output terminal of the inverter, and a source connected to the second power supply voltage.

11. The flip-flop circuit of claim 6, wherein the internal latch unit includes:
a first inverter having an input terminal connected to the internal node;
a second inverter having an input terminal connected to an output terminal of the first inverter; and
a transmission gate configured to apply a voltage received from an output terminal of the second inverter to the internal node in response to the clock signal and the first pulse signal.

12. The flip-flop circuit of claim 1, further comprising an output latch unit connected to the output node.

13. The flip-flop circuit of claim 12, wherein the output latch unit includes:
a first inverter having an input terminal connected to the output node; and
a second inverter having an input terminal connected to an output terminal of the first inverter and an output terminal connected to the output node.

14. The flip-flop circuit of claim 1, wherein the precharge transistor precharges the internal node to the first power supply voltage in response to a delayed signal of the clock signal.

15. The flip-flop circuit of claim 14, further comprising a pulse generating circuit, wherein the pulse generating circuit includes:
a delay unit configured to generate the delayed signal of the clock signal and an inversion signal of the delayed clock signal; and
a NAND gate configured to perform an NAND operation on the clock signal and the inversion signal of the delayed clock signal to generate an inversion signal of the pulse signal.

16. The flip-flop circuit of claim 1, wherein the precharge transistor precharges the internal node to the first power supply voltage in response to a first pulse signal.

17. A pipeline circuit comprising:
a pulse generating circuit configured to generate a delayed signal of a clock signal and an inversion signal of a pulse signal;
a first flip-flop group including a plurality of flip-flops, the first flip-flop group configured to generate output signals by sampling input signals in response to the delayed signal of the clock signal and the inversion signal of the pulse signal;
a combination logic circuit configured to perform a logic operation on the output signals received from the first flip-flop group; and
a second flip-flop group including a plurality of flip-flops, the second flip-flop group configured to generate output signals by sampling signals received from the combination logic circuit in response to the delayed signal of the clock signal and the inversion signal of the pulse signal,
wherein each of the flip-flops included in the first and second flip-flop groups includes:
a precharge transistor configured to precharge an internal node to a first power supply voltage in response to the clock signal;
a first pull-down unit configured to pull down a voltage of the internal node to a second power supply voltage, the second power supply voltage being lower than the first power supply voltage;
a pull-up transistor configured to pull up a voltage of an output node to the first power supply voltage in response to the voltage of the internal node; and
a second pull-down unit configured to pull down the voltage of the output node to the second power supply voltage, wherein the first pull-down unit includes:
a first pull-down transistor configured to pull down the voltage of the internal node in response to an input data signal, the input data signal being one of the sampled input signals; and
a second pull-down transistor configured to pull down the voltage being pulled down by the first pull-down transistor to the second power supply voltage in response to a first pulse signal, and to not pull down the voltage being pulled down by the first pull-down transistor in response to the output signal.

18. The pipeline circuit of claim 17, wherein the pulse generating circuit is configured to generate the inversion signal of the pulse signal generated from the clock signal, the first flip-flop group generating output signals by sampling the input signals in response to the inversion signal of the pulse signal, the second flip-flop group generating output signals by sampling signals received from the combination logic circuit in response to the inversion signal of the pulse signal.

19. A pipeline circuit comprising:

a pulse generating circuit configured to generate a delayed signal of a clock signal and an inversion signal of a pulse signal;

a plurality of flip-flop groups, each flip-flop group including a plurality of flip-flops and configured to generate output signals by sampling input signals in response to the delayed signal of the clock signal and the inversion signal of the pulse signal; and a plurality of combination logic circuits connected between the plurality of flip-flop groups, wherein each combination logic circuit is configured perform a logic operation on the output signals received from a corresponding flip-flop group among the plurality of flip-flop groups to generate output signals, and to apply the output signals to a subsequent flip-flop group, wherein each of the flip-flops includes:

a precharge transistor configured to precharge an internal node to a first power supply voltage in response to the clock signal;

a first pull-down unit configured to pull down a voltage of the internal node to a second power supply voltage, the second power supply voltage being lower than the first power supply voltage;

a pull-up transistor configured to pull up a voltage of an output node to the first power supply voltage in response to the voltage of the internal node; and a second pull-down unit configured to pull down the voltage of the output node to the second power supply voltage, wherein the first pull-down unit includes:

a first pull-down transistor configured to pull down the voltage of the internal node in response to an input data signal, the input data signal being one of the sampled input signals; and a second pull-down transistor configured to pull down the voltage being pulled down by the first pull-down transistor to the second power supply voltage in response to a first pulse signal, and to not pull down the voltage being pulled down by the first pull-down transistor in response to the output signal.

20. The pipeline circuit of claim 19, wherein the pulse generating circuit is configured to generate only the inversion signal of the pulse signal, and the each flip-flop group is configured to generate the output signal by sampling input signals in response to the inversion signal of the pulse signal.

21. A method of operating a flip-flop circuit, the method comprising:

precharging an internal node to a first power supply voltage in response to a clock signal;

pulling down a voltage of the internal node by using a first pull-down transistor in response to an input data signal;

pulling down the voltage being pulled down by the first pull-down transistor to a second power supply voltage by using a second pull-down transistor in response to a pulse signal, and not pulling down the voltage being pulled down by the first pull-down transistor by using the second pull-down transistor in response to an output signal, the pulse signal being generated from a combination of the clock signal and the output signal, the second power supply voltage being lower than the first power supply voltage; and pulling up a voltage of an output node to the first power supply voltage in response to the voltage being pulled down by the second pull-down transistor.

22. The method of claim 21, wherein precharging the internal node to the first power supply voltage is performed in response to a delayed signal of the clock signal.

23. The method of claim 21, wherein precharging the internal node to the first power supply voltage is performed in response to a first pulse signal.

24. The method of claim 21, further comprising:

pulling down the voltage of the output node by using a third pull-down transistor in response to an inversion signal of the input data signal; and pulling down the voltage being pulled down by the third pull-down transistor to the second power supply voltage using a fourth pull-down transistor in response to a second pulse signal generated from the clock signal.

* * * * *